US006535061B2

(12) United States Patent
Darmawaskita et al.

(10) Patent No.: US 6,535,061 B2
(45) Date of Patent: Mar. 18, 2003

(54) CONFIGURABLE OPERATIONAL AMPLIFIER AS A MICROCONTROLLER PERIPHERAL

(75) Inventors: Hartono Darmawaskita, Chandler, AZ (US); Layton Eagar, Mesa, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/731,381

(22) Filed: Dec. 6, 2000

(65) Prior Publication Data

US 2002/0067206 A1 Jun. 6, 2002

(51) Int. Cl.[7] .............................. H03F 3/45; H03F 3/14
(52) U.S. Cl. ...................... 330/254; 330/252; 330/307; 330/257
(58) Field of Search .................... 330/254, 252, 330/307, 257

(56) References Cited

U.S. PATENT DOCUMENTS 4,641,108 A * 2/1987 Gill, Jr. ..................... 330/307
5,563,526 A * 10/1996 Hastings et al. ............ 326/37

OTHER PUBLICATIONS

PCT US/ 01/46990 Search Report and Written Opinion Jul. 16, 2002.
Eschauzier R. G. H. et al., "A Programmable 1.5 V. CMOS Class–AB Operational Amplifier with Hybrid Nested Miller Compensation for 120 DB Gain and 6 MHZ UGF" IEEE Journal of Solid–State Circuits, IEEE, Inc. New York, US vol. 29, No. 12, pp. 1497–1504 XP000495325 Dec. 1, 1994.
Mayes, M K et al., "A 200 MW, 1 MSAMPLE/S 16–B Microcontroller" IEEE Journal of Solid–State Circuits, IEEE, Inc. New York, US, vol. 31, No. 12, pp. 1862–1872 XP000691803 Dec. 1, 1996.

* cited by examiner

Primary Examiner—Patricia Nguyen
(74) Attorney, Agent, or Firm—Baker Botts L.L.P.

(57) ABSTRACT

A configurable operational amplifier which is programmed to specific characteristics and parameters for various requirements in the measurement of analog signals. These programmable characteristics and parameters are gain bandwidth product (GBWP), selection of operational amplifier (op-amp) or comparator modes of operation, input offset zero calibration, ultra low input bias current, rail-to-rail input operation, and rail-to-rail output operation. The configurable operational amplifier is used in combination with a microcontroller system, and may be fabricated on an integrated circuit die or in a multi-chip package.

32 Claims, 11 Drawing Sheets

CONFIGURABLE OPERATIONAL AMPLIFIER AS A MICROCONTROLLER PERIPHERAL

RELATED APPLICATIONS

This patent application is related to commonly owned U.S. patent applications: Ser. No. 09/675,355, filed Sep. 29, 2000, entitled "Comparator Programmable for High-Speed or Low-Power Operation" by Hartono Darmawaskita and Miguel Moreno; and Ser. No. 09/676,389, filed Sep. 29, 2000, entitled "Auto-Calibration Circuit to Minimize Input Offset Voltage in an Integrated Circuit Analog Input Device" by Hartono Darmawaskita, Layton Eagar and Miguel Moreno; both applications are hereby incorporated by reference herein for all purposes.

BACKGROUND OF THE INVENTION

This invention relates to integrated circuit microcontrollers, and, more particularly, to an integrated circuit microcontroller having a configurable operational amplifier as a peripheral.

DESCRIPTION OF THE RELATED TECHNOLOGY

Integrated circuit microcontrollers are becoming far more sophisticated while continuing to drop in price. More and more consumer and commercial products, such as for example but not limited to, appliances, telecommunications devices, automobiles, security systems, full-house instant hot water heaters, thermostats, and the like are being controlled by these integrated circuit microcontrollers. Analog inputs for receiving sensor information and analog outputs for controlling functions are necessary for the application of these microcontrollers. Heretofore separate and discrete analog interfaces were used to connect the digital microcontroller to the outside world.

Analog input devices such as an analog-to-digital converter (ADC) in conjunction with a separate operational amplifier were used to convert a time-varying analog signal into digital representations thereof for application to digital inputs and use thereof by the microcontroller. Voltage and current levels were also detected by discrete integrated circuit voltage comparators that changed a digital output state when a certain analog value was present on the input of the comparator.

Different applications required different speeds for the ADC-Op Amp and the comparators. This was not a problem since the ADC-OP Amp and the comparators were separate integrated circuit devices that could be selected for the specific applications. Technology has now advanced to the point where the analog input and output devices can be fabricated on which the same integrated circuit die that the digital microcontroller and its support logic and memories are also fabricated.

A problem exists, however, in that these analog input microcontrollers must interface with very different analog input parameters such as speed, gain, offset, common mode rejection, linearity and the like. In addition, different applications of the analog input microcontroller may have restrictions on the amount of power available to run the microcontroller and its integral analog peripherals. Since there are so many different combinations of analog input and systems parameters, a great number of different types of integrated circuit analog input microcontrollers are required. This precludes any cost reductions because there is no economics of scale through the possibility of increased production quantities.

What is needed is an integrated circuit microcontroller having analog input peripherals that can be programmably adapted for measurement and control applications requiring different analog input parameters, and can be further mass-produced to reduce overall product costs.

SUMMARY OF THE INVENTION

The invention overcomes the above-identified problems as well as other shortcomings and deficiencies of existing technologies by providing on a single integrated die or multi-chip package (MCP) a microcontroller system having a configurable operational amplifier that can be programmed for specific characteristics and parameters which are adapted to various requirements in the measurement of analog signals for a specific application. In another embodiment of the invention, a plurality of configurable operational amplifiers, each being configurable with the same or a different characteristic than the others, is programmably selectable for a specific operation in combination with the microcontroller.

The configurable operational amplifier, according to the present invention, may comprise, for example, but not limited to, the following programmable features: programmable gain bandwidth product (GBWP), programmable selection of operational amplifier (op-amp) or comparator modes of operation, input offset zero calibration, ultra low input bias current, rail-to-rail input operation, and rail-to-rail output operation. The configurable op-amp may also be programmed to a "sleep mode" which further reduces system power requirements.

The programmable gain bandwidth product (GBWP) feature enables the configurable op-amp of the invention to be utilized for slow, medium or high speed applications. Conservation of power in battery powered applications is readily facilitated by configuring the op-amp in a low GBWP mode, since the op-amp will consume a minimum amount of power from the power supply (battery).

The programmable selection of operational amplifier (op-amp) or comparator modes of operation feature enables a configurable op-amp to also be utilized in an application as a comparator in combination with the microcontroller. This feature adds flexibility and increased capabilities in the application of the microcontroller system.

The input offset zero calibration feature may be used to minimize the input offset voltage of the op-amp. This feature enables the op-amp to be used for high gain applications, for example, but not limited to, instrumentation sensors such as temperature, pressure, vibration, humidity, gas, ozone, pH, vibration, battery charge and the like. The input offset zero calibration feature may be invoked on demand during start-up of the microcontroller system or at any time during operation thereof. This feature enables the op-amp to maintain an extremely low input offset voltage over the entire operating range of voltage and temperature which occurs during operation of the application.

The ultra low input bias current feature allows the op-amp to be used in very high impedance sensor applications.

The rail-to-rail input feature allows the op-amp to be used in applications requiring resolution of input signal values that are equal to or less than the power supply rails (such as voltages $V_{DD}$ or $V_{SS}$).

The rail-to-rail output feature allows the op-amp to take advantage of the full input range of an analog-to-digital converter (ADC), i.e., maximum use of the total bit range (scale) of the ADC.

An advantage of the invention is the ability to minimize design time and inventory because multiple types of operational amplifiers do not have to be specified, purchased and/or kept in inventory.

Another advantage is simplification of manufacturing requirements by reducing the number of different types of microcontroller op-amp type integrated circuit parts needed and increasing the quality of the same type of part manufactured.

Still another advantage is producing a microcontroller system having analog input capabilities that may be used for a very broad range of applications, which further enhances the demand for a general purpose microcontroller system available on an integrated circuit die or in a MCP.

In an embodiment of the configurable op-amp, nulling of input offset voltage of the differential amplifier may be performed. In addition to the high speed or low power modes, the configurable op-amp may have a power down feature for further reducing power consumption of the integrated circuit. Furthermore the configurable op-amp may have a "bolt-on compression preamp" which enables a common mode input voltage range from ground ($V_{SS}$) to the power supply voltage ($V_{DD}$), rail-to-rail input. This enables small or large signal operation of the configurable op-amp at or near either or both power supply voltages.

This bolt-on compression preamp performs a one to one voltage mapping of a rail to rail voltage input to an output which is not rail to rail. In an ac signal sense the circuit has less than unity gain. This allows the input differential stage of the operational amplifier to be in the saturation region of operation regardless of common mode voltage input. The only thing that is sacrificed is open loop gain which may be reduced by approximately 6 dB.

The configurable operational amplifier has a biasing circuit that allows for approximately a 10 to 1 power current consumption selection with resulting gain bandwidth product performance changes. The configurable operational amplifier also has a input voltage offset nulling circuit which is controlled by a small resistor and a current that is between the two emitters of the input differential transistor pair. The configurable operational amplifier may be designed around a folded cascode architecture so the entire circuit may scale with the biasing circuit.

Other and further features and advantages will be apparent from the following description of presently preferred embodiments of the invention, given for the purpose of disclosure and taken in conjunction with the accompanying drawings.

DETAILED DESCRIPTION OF THE PREFERRED EMBODIMENTS

Figure 1:
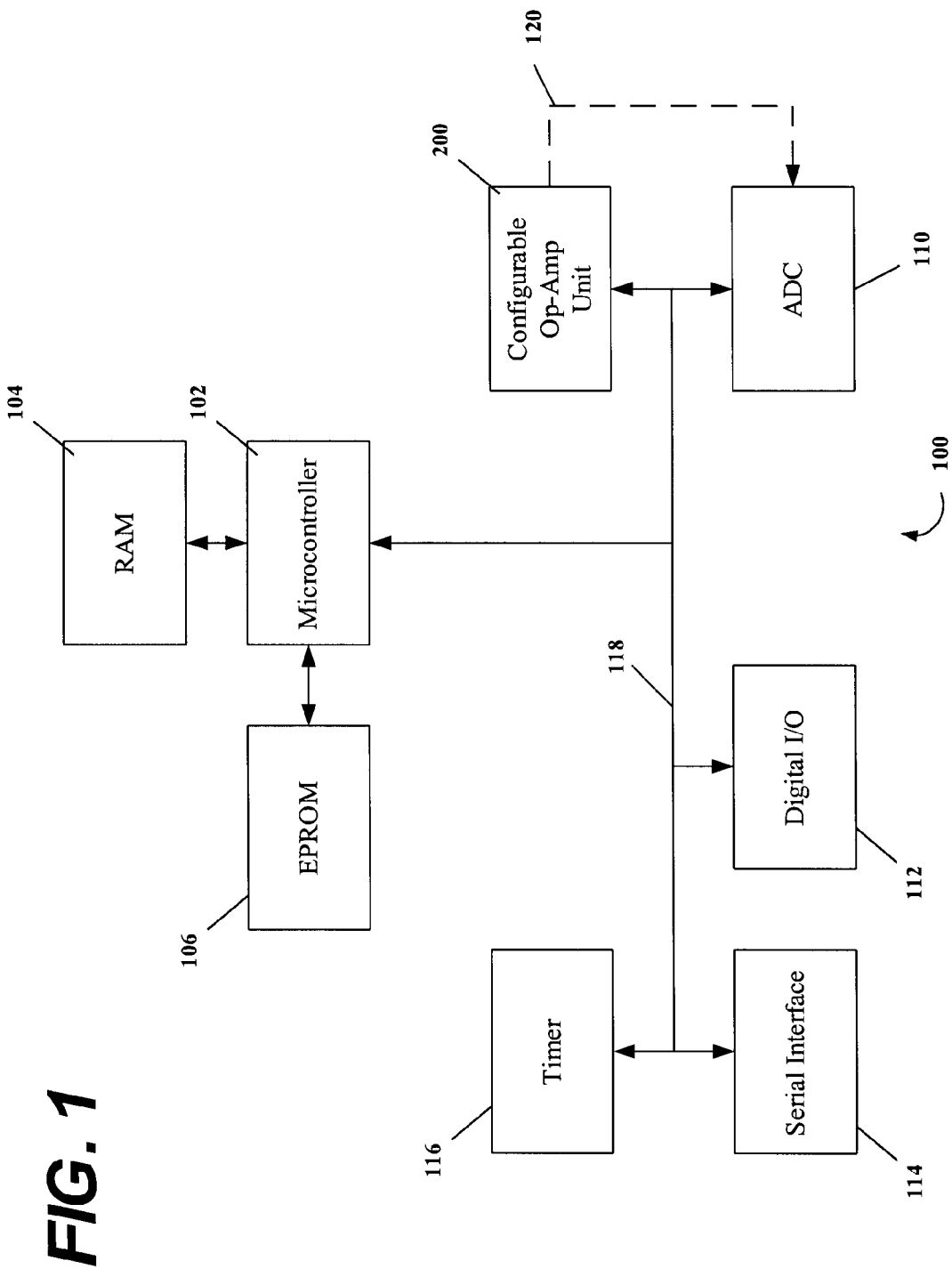
FIG. 1 is a schematic block diagram of a microcontroller system having a configurable operational amplifier.

The invention is a configurable operational amplifier (op-amp) having programmable parameters in combination with a microcontroller system fabricated on an integrated circuit die or in a multi-chip package (MCP). The configurable op-amp can have its gain bandwidth product (GBWP) selected over a range of from fast to slow for improved high speed operation, or to minimizing current drain and power in a battery powered application. The op-amp can be configured as either an analog input/output device or as a comparator having two analog inputs and a digital output for direct connection to a digital input of the microcontroller. The configurable op-amp can be calibrated to minimize the input voltage offset, and may be configured for ultra low input bias current. The configurable op-amp may effectively operate with a rail-to-rail common mode input range, and/or be capable of rail-to-rail output operation. The configurable opamp may be placed in a "sleep mode" when not being used for further savings in power.

The configurable op-amp is preferably fabricated on the same integrated circuit die or in the same multi-chip package (MCP) as a microcontroller system and, therefore, becomes a very low cost analog peripheral of the microcontroller system. According to the invention, a plurality of configurable op-amps may be used with and preferably fabricated on the same integrated circuit die or in the same MCP as the microcontroller system.

Referring now to the drawings, the details of preferred embodiments of the invention are schematically illustrated. Like elements in the drawings will be represented by like numbers, and similar elements will be represented by like numbers with a different lower case letter suffix.

Referring to FIG. 1, a schematic block diagram of a microcontroller system having a configurable operational amplifier is illustrated. The integrated circuit microcontroller system is generally represented by the numeral 100 and comprises a microcontroller 102, random access memory (RAM) 104, program memory 106, a configurable operational amplifier (op-amp) 200, an analog-to-digital converter (ADC) 110, a digital input-output (I/O) 112, a serial interface 114 and a timer 116. More than one configurable op-amp 200 is contemplated and within the scope of the present invention. In addition, other and further functions may be part of the integrated circuit (IC) microcontroller system 100. An example of an IC microcontroller system having a plurality of functions is illustrated in commonly owned U.S. Pat. No. 5,619,430 by Nolan et al., and is hereby incorporated by reference for all purposes.

The microcontroller system 100 may be fabricated on one or more integrated circuit dice and enclosed in an integrated circuit package. The integrated circuit package may be, for example, but is not limited to, plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), T0-220, T0-247, T0-263 and the like.

Figure 2:
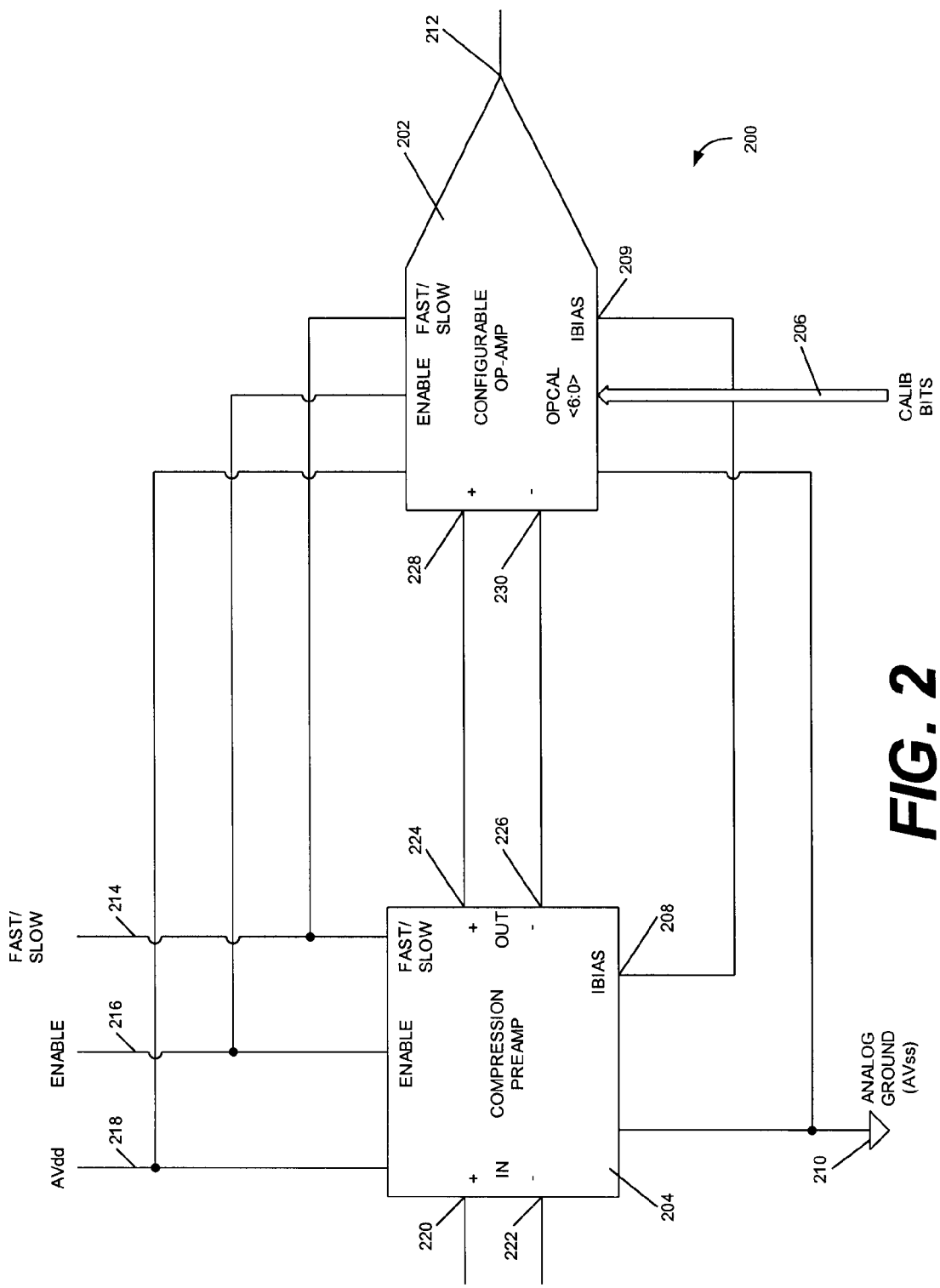
FIG. 2 is a schematic block diagram of the configurable operational amplifier of FIG. 1.

Referring now to FIG. 2, a schematic block diagram of the configurable op-amp embodiment of the invention is illustrated. The configurable amplifier is generally represented by the numeral 200 and comprises a compression preamplifier (preamp) 204 and a configurable operational amplifier (op-amp) 202. The preamp 204 compresses the input voltage range, that is ground reference to the positive power supply input, to an output that is "monotonic" one-to-one mapping from the input side. The voltage range is "compressed" because the output voltage range is not ground reference to positive power supply input. This allows the input differential circuit of the configurable op-amp 202 to operate within its optimum voltage range. This is how "ground reference to positive power supply input" for the common mode range of the entire configurable amplifier 200 is achieved.

The preamp input comprises a positive input 220, IN+, and a negative input 222, IN−. The preamp output comprises a positive output 224 and a negative output 226. Power is connected to the preamp 204 at a positive analog voltage 218, AVdd, and analog ground reference 210, AVss. The preamp 204 is also controlled by an enable input 216 and a fast/slow input 214. The preamp 204 also has a bias output 208, IBIAS.

The configurable op-amp 202 functions in the saturation region of operation because the small signal (alternating current) gain of the preamp 204 is less than one. Saturation, therefore, is achieved by means of the direct connections between preamp outputs 224 and 226 and op-amp inputs 228 and 230, respectively. The op-amp 202 is also controlled by the enable input 216 and the fast/slow input 214. The op-amp 202 receives its operating voltage between the positive analog voltage 218 and the analog ground reference 210. The IBIAS for the input 208 of the compression preamp 204 is generated at the output 209 of the configurable op-arnp 202. The op-amp input labeled OPCAL <6:0> is controlled by a six-bit calibration bus 206. The op-amp has an output 212.

Figure 3A:
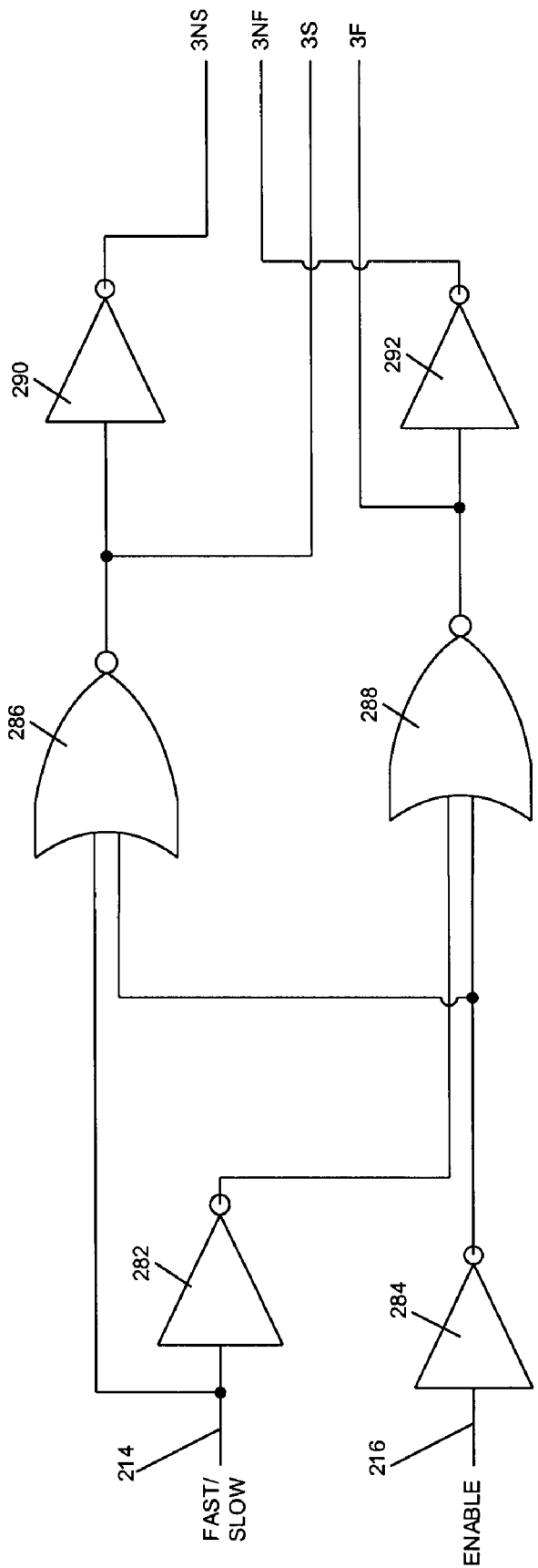
FIGS. 3a and 3b are a more detailed schematic circuit diagram of an embodiment a preamplifier of the configurable operational amplifier of FIG. 2.
Figure 3B:
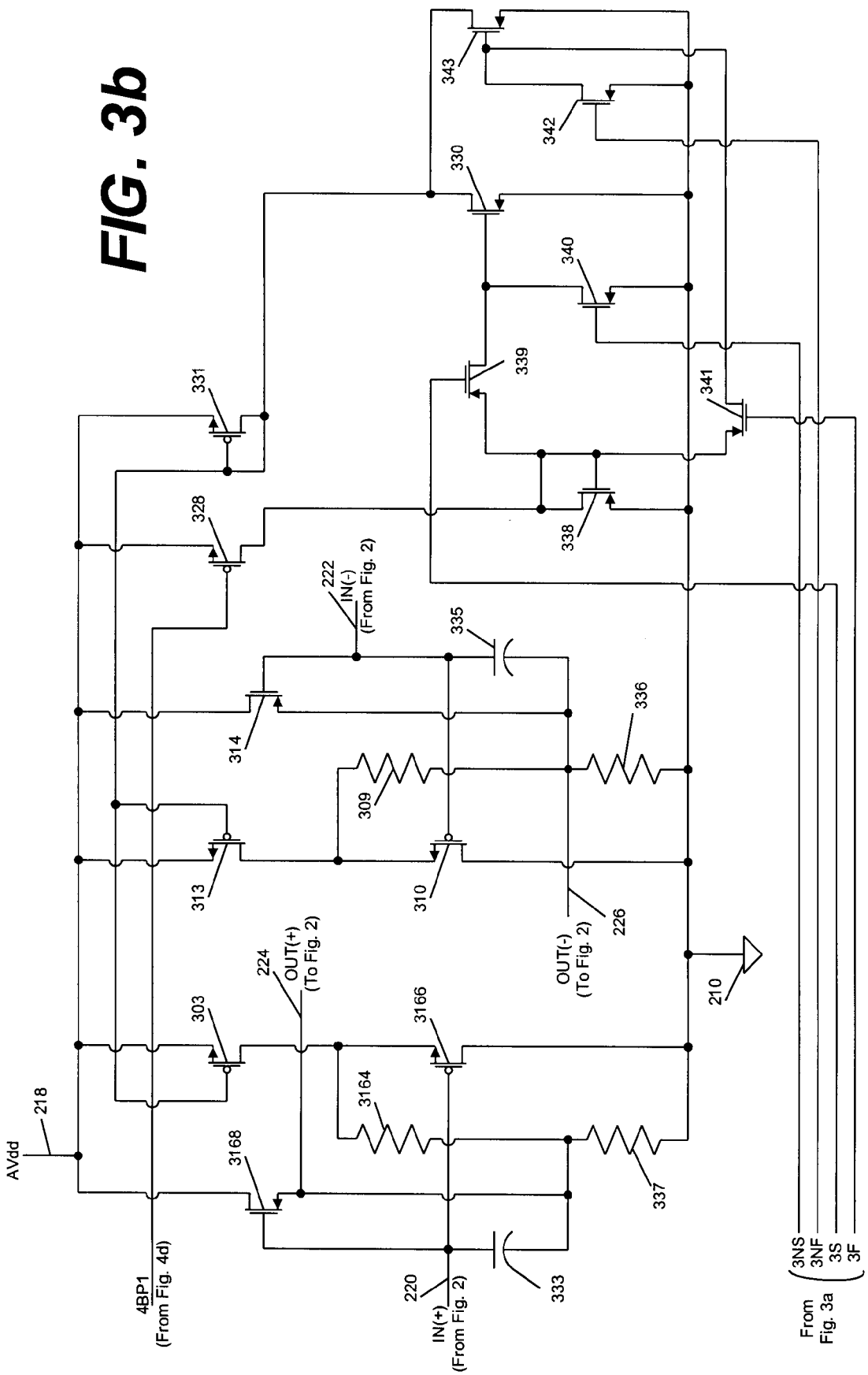

Referring to FIGS. 3a and 3b, a more detailed schematic circuit diagram of an embodiment of the preamplifier (preamp) 204 of FIG. 2 is illustrated. Fast/slow input 214 is connected to the input of inverter 282 and to a first input of NOR gate 286. Enable input 216 is connected to the input of inverter 284. The output of inverter 284 is connected to a second input of NOR gate 286 and to a first input of NOR gate 288. The output of inverter 282 is connected to a second input of NOR gate 288. The output of NOR gate 286 is connected to the input of inverter 290 and to the gate of transistor 339. The output of the inverter 290 is connected to the gate of transistor 340. The output of NOR gate 288 is connected to the input of inverter 292 and to the gate of transistor 341. The output of inverter 292 is connected to the gate of transistor 342. The analog power supply voltage 218 is connected to the sources of transistors 303, 313, 328 and 331, and to the drains of transistors 3168 and 314. The gates of transistors 303, 313, and 331 are connected together. The transistors may be, for example but not limited to, N-Channel and P-channel polysilicon gate field effect transistors, respectively.

The positive power supply 220 is connected to the gate of transistor 3168, the gate of transistor 3166 and capacitor 333. The source of transistor 3168 is connected to the positive preamp output 224, to capacitor 333 and to resistors 3164 and 337. The resistor 337 is also connected to the ground reference 210 as is the source of transistor 3166. The drain of transistor 3166 is connected to resistor 3164 and to the drain of transistor 303.

Negative preamp input 222 is connected to the gate of transistor 314, the gate of transistor 310 and to capacitor 335. The drain of transistor 314 is connected to the negative preamp output 226, to capacitor 335, to resistor 309, and to resistor 336. The resistor 336 is also connected ground reference 210, and the source of transistor 310 is connected to ground reference 210. The drain of transistor 310 is connected to the resistor 309 and to the drain of transistor 313.

The drain of transistor 328 is connected to the source and gate of transistor 338, to the source of transistor 339 and to the source of transistor 341. The source of transistor 330 is connected to the gate and drain of transistor 331 and to the source of transistor 343. The drain of transistor 341 is connected to the gate of transistor 343 and to the source of transistor 342. The drain of 339 is connected to the gate of 330 and to the source of 340. The drains of transistors 338, 340, 330, 342 and 343 are connected to ground reference 210.

Referring now to FIGS. 4a–4e, a more detailed schematic circuit diagram of the configurable op-amp 202 of FIG. 2 is illustrated. The enable input 216 is connected to the input of inverter 262 and to a first input of NAND gate 270 and to the gates of transistors 414, 473 and 470. The output of inverter 262 is connected to a first input of NOR gate 266 and to the gates of transistors 484, 488, 474 and 469. Fast/slow input 214 is connected to a second input of NAND gate 270 and to a second input of NOR gate 266. The output of NAND gate 270 is connected to the input of inverter 264 and the gate of transistor 441. The output of inverter 264 is connected to the gate of transistor 440. The output of NOR gate 266 is connected to the input of inverter 268 and the gate of transistor 451. The output of inverter 268 is connected to the gate of transistor 444.

Figure 4A:
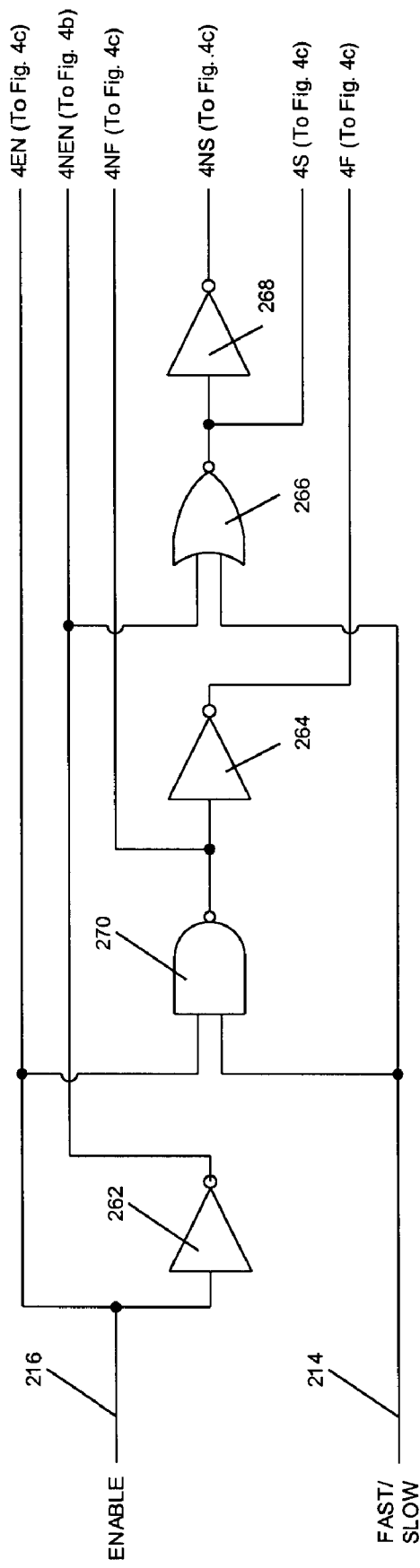
FIGS. 4a–4e is a schematic circuit diagram of the configurable operational amplifier of FIG. 2.
Figure 4B:
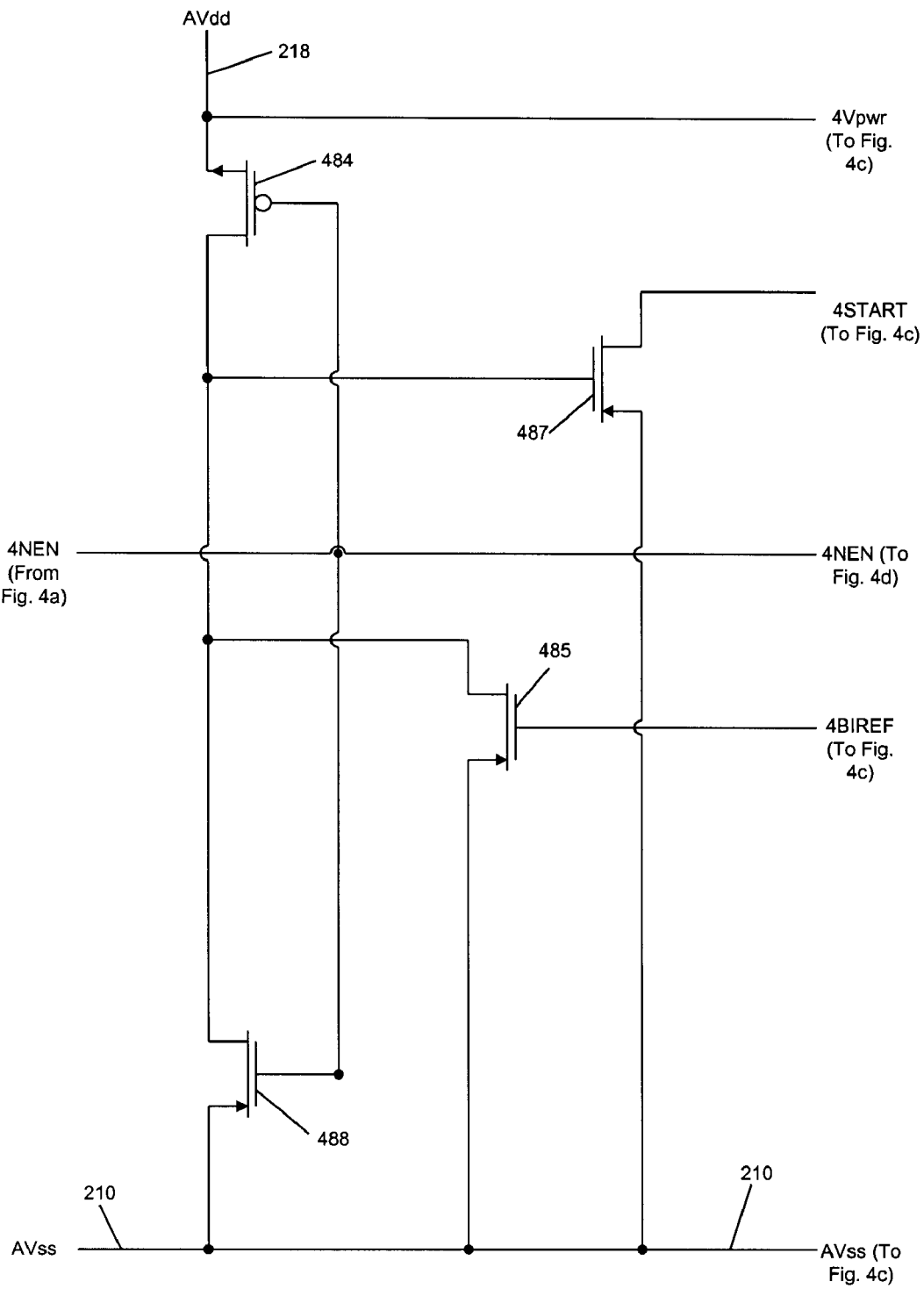

FIG. 4b is a circuit diagram of a startup stage of the configurable op-amp 202. The positive power supply voltage 218 is connected to the source of transistor 484. The drain of transistor 484 is connected to the gate of transistor 487, to the drain of transistor 485 and to the drain of transistor 488. The gate of transistor 484 is connected to the gate of transistor 488. The drain of transistor 487 is connected to the drains of transistors 406 and 401, and the gates of transistors 406, 407 and 497. The gate of transistor 485 is connected to the source of transistor 440, the source of transistor 407, the source of transistor 451, the gate and drain of transistor 402, and the gates of transistors 494 and 478. The sources of transistors 488, 485 and 487 are connected to ground reference 210.

Figure 4C:
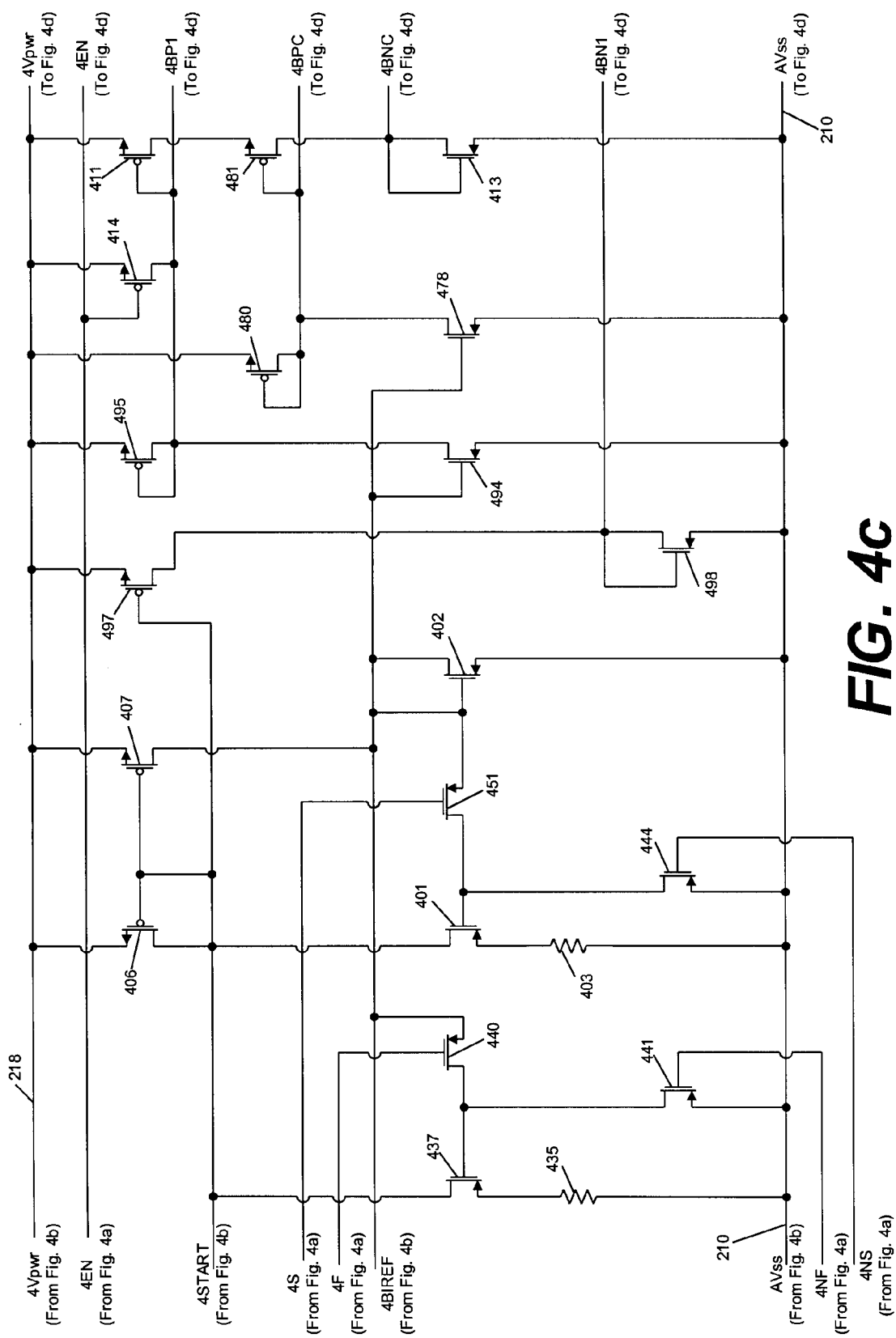

FIG. 4c is a circuit diagram of a bias stage of the configurable op-amp 202. The positive power supply voltage 218 is connected to the sources of transistors 406, 407 and 497, and to the drains of transistors 495, 480, 414 and 411. The enable input 216 is connected to the gate of transistor 414. The gate and drain of transistor 406, gate of transistor 407, the gate of transistor 497, the drain of transistor 437 and the drain of transistor 401 are connected to the drain of transistor 487. The gate of transistor 451 is connected to the output of the NOR gate 266. The gate of transistor 440 is connected to the output of inverter 264. The source of transistor 440, the drain of transistor 407, the source of transistor 451, the gate and the drain of transistor 402, the gate of transistor 494 and the gate of transistor 478 are connected to the gate of transistor 485. The gate of transistor 441 is connected to the output of the NAND gate 270. The gate of transistor 444 is connected to the output of inverter 268. The source of transistor 437 is connected to resistor 435. The gate of transistor 437 is connected to the drain of transistor 440 and to the drain of transistor 441. The resistor 435 is also connected to ground reference 210.

The source of transistor 401 is connected to resistor 403. The gate of transistor 401 and the drain of transistor 451 are connected to the drain of transistor 444. Resistor 403 is connected to ground reference 210. The drain of transistor 497 and the gates of transistors 419 and 420 are connected to the gate and drain of transistor 498. The drain of transistor 495, the gate of transistor 495, the drain of transistor 414, the gate of transistor 411, the drain of transistor 494, and the gates of transistors 415, 400, and 431 are connected to a first input of the Current Source Op-Amp Calibration function block 610 (see FIG. 5).

The drain of transistor 411 is connected to the drain of transistor 481. The gate of transistor 480, the drain of transistor 480, the drain of transistor 478, and the gate of transistor 481 are connected to the gates of transistors 482 and 483. The drain of transistor 481 and the gate and the drain of transistor 413 are connected to the gates of transistors 421 and 422. The sources of transistors 441, 444, 402, 498, 494, 478, and 413 are connected to ground reference 210.

Figure 4D:
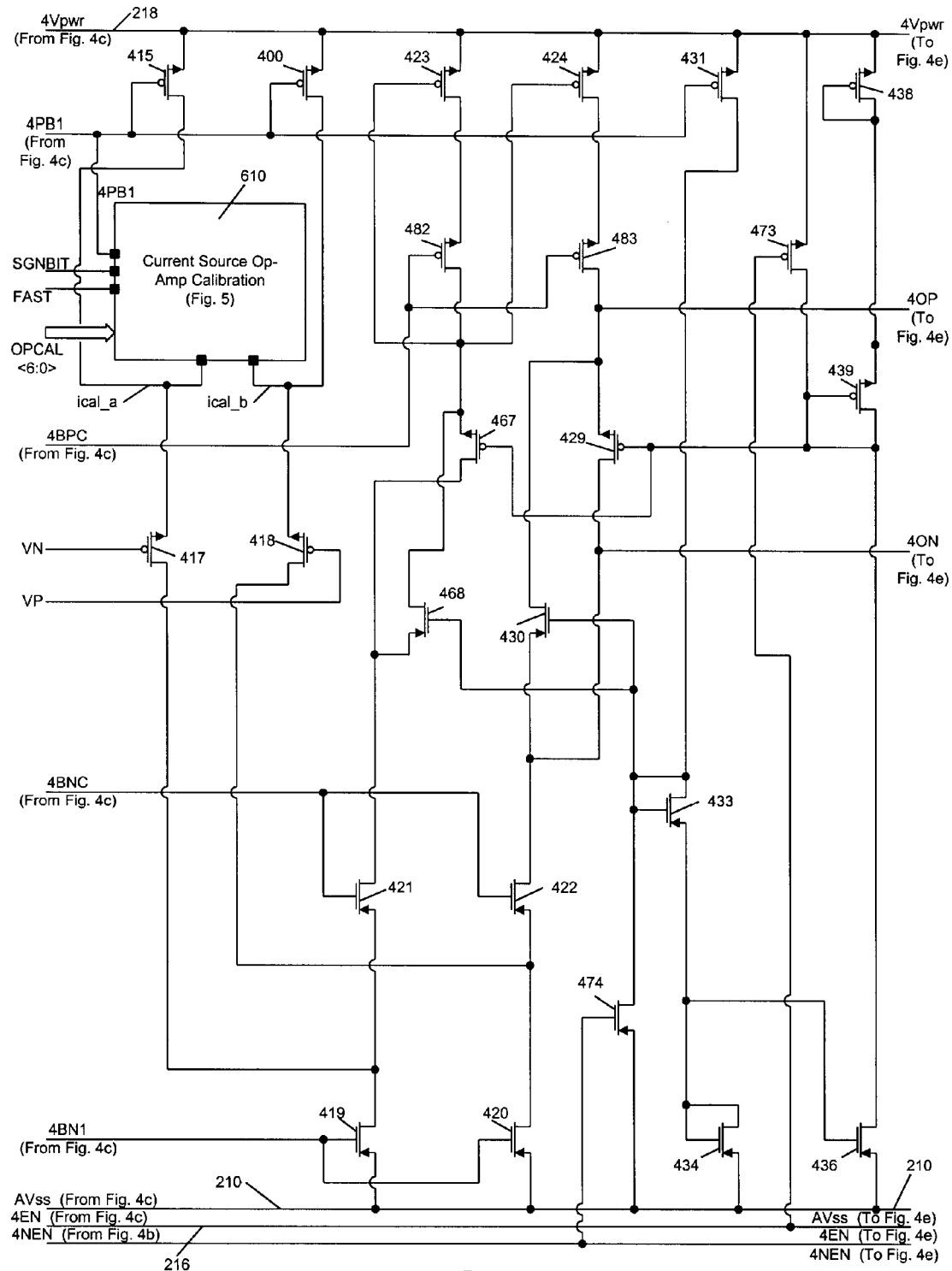

FIG. 4d is a circuit diagram of a folded cascode input stage of the configurable op-amp 202. The positive power supply voltage 218 is connected to the sources of transistors 415, 400, 423, 424, 431, 473, and 438. The enable input 216 is connected to the gate of transistor 473. The output of inverter 262 is connected to the gate of transistor 474. The VPBI(Bias) of current source op-amp calibration function block 610 and the gates of transistors 415, 400, and 431 are connected to the drain of transistor 495, the gate of transistor 495, the drain of transistor 414, the gate of transistor 411, and the drain of transistor 494. The op-amp input labeled SGNBIT is connected to a second input of the op-amp calibration function block 610. The op-amp input labeled FAST is connected to a third input of the op-amp calibration function block 610. Calibration bus 206 is connected to fourth through ninth inputs of the op-amp calibration function block 610.

A first calib-op output, labeled ical_a, is connected to the source of transistor 417 and the drain of transistor 415. A second calib-op output, labeled ical_b, is connected to the source of transistor 418 and the drain of transistor 400.

The gates of transistors 482 and 483 are connected to the gate of transistor 480, the drain of transistor 480, the drain of transistor 478, and the gate of transistor 481. The op-amp inputs labeled VN and VP are connected to the gates of transistors 417 and 418, respectively. The gates of transistors 421 and 422 are connected to the drain of transistor 481 and the gate and the drain of transistor 413. The gates of transistors 419 and 420 are connected to the drain of transistor 497 and the gate and drain of transistor 498.

The gate of transistor 423 is connected to the gate of transistor 424, the drain of transistor 482, the source of transistor 467, and the drain of transistor 468. The drain of transistor 467 is connected to the source of transistor 468 and the drain of transistor 421.

The drain of transistor 417 is connected to the source of transistor 421 and the drain of transistor 419. The drain of transistor 418 is connected to the source of transistor 422 and to the drain of transistor 420. The gate of transistor 467 is connected to the gates of transistors 429 and 439, the drains of transistors 439 and 473, and the drain of transistor 436.

The gate of transistor 468 is connected to the gates of transistors 430 and 433, the drains of transistors 474 and 433, and the drain of transistor 431. The source of transistor 433 is connected to the gates of transistors 434 and 436 and the drain of transistor 434.

The drain of transistor 483, the source of transistor 429, and the drain of transistor 430 are connected to capacitor 446, the drain of transistor 470, and the gate of transistor 442. The drain of transistor 429, the source of transistor 430, and the drain of transistor 422 are connected to capacitor 445, the drain of transistor 469, and the gate of transistor 443. The sources of transistors 419, 420, 474, 434, and 436 are connected to ground reference 210.

Figure 4E:
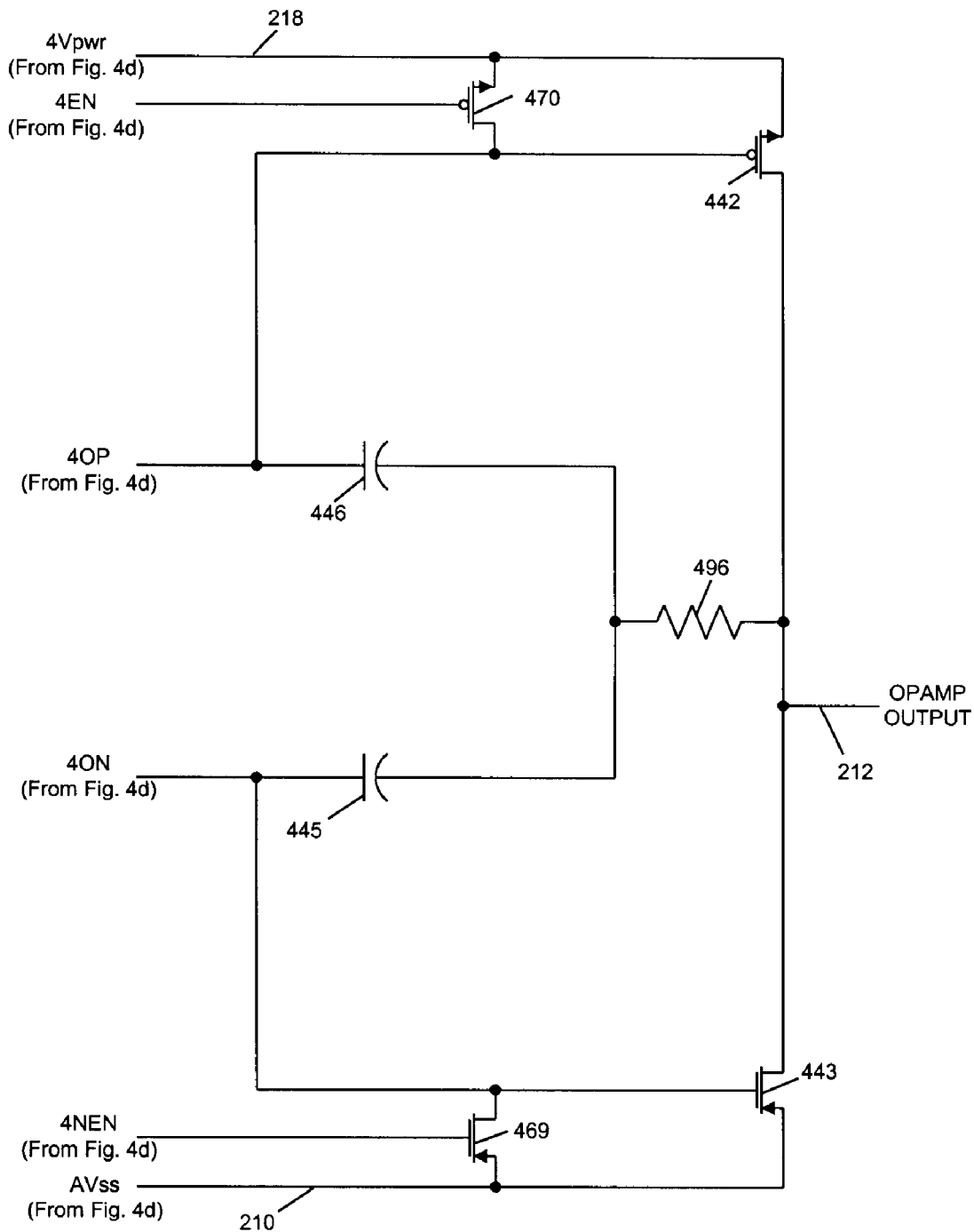

FIG. 4e is a circuit diagram of an output stage of op-amp 202. The positive power supply voltage 218 is connected to the sources of transistors 470 and 442. The enable input 216 is connected to the gate of transistor 470. The output of inverter 262 is connected to the gate of transistor 469. The sources of transistors 469 and 443 are connected to ground reference 210.

The capacitor 446, the drain of transistor 470, and the gate of transistor 442 are connected to the drain of transistor 483, the source of transistor 429, and the drain of transistor 430. The drain of transistor 469, the gate of transistor 443, and the capacitor 445 are connected to the drain of transistor 429, the source of transistor 430, and the drain of transistor 422.

On one side, resistor 496 is connected to the capacitor 446 and the capacitor 445. On the other side, resistor 496 is connected to the drain of transistor 442, the drain of transistor 443, and op-amp output 212.

Figure 5A:
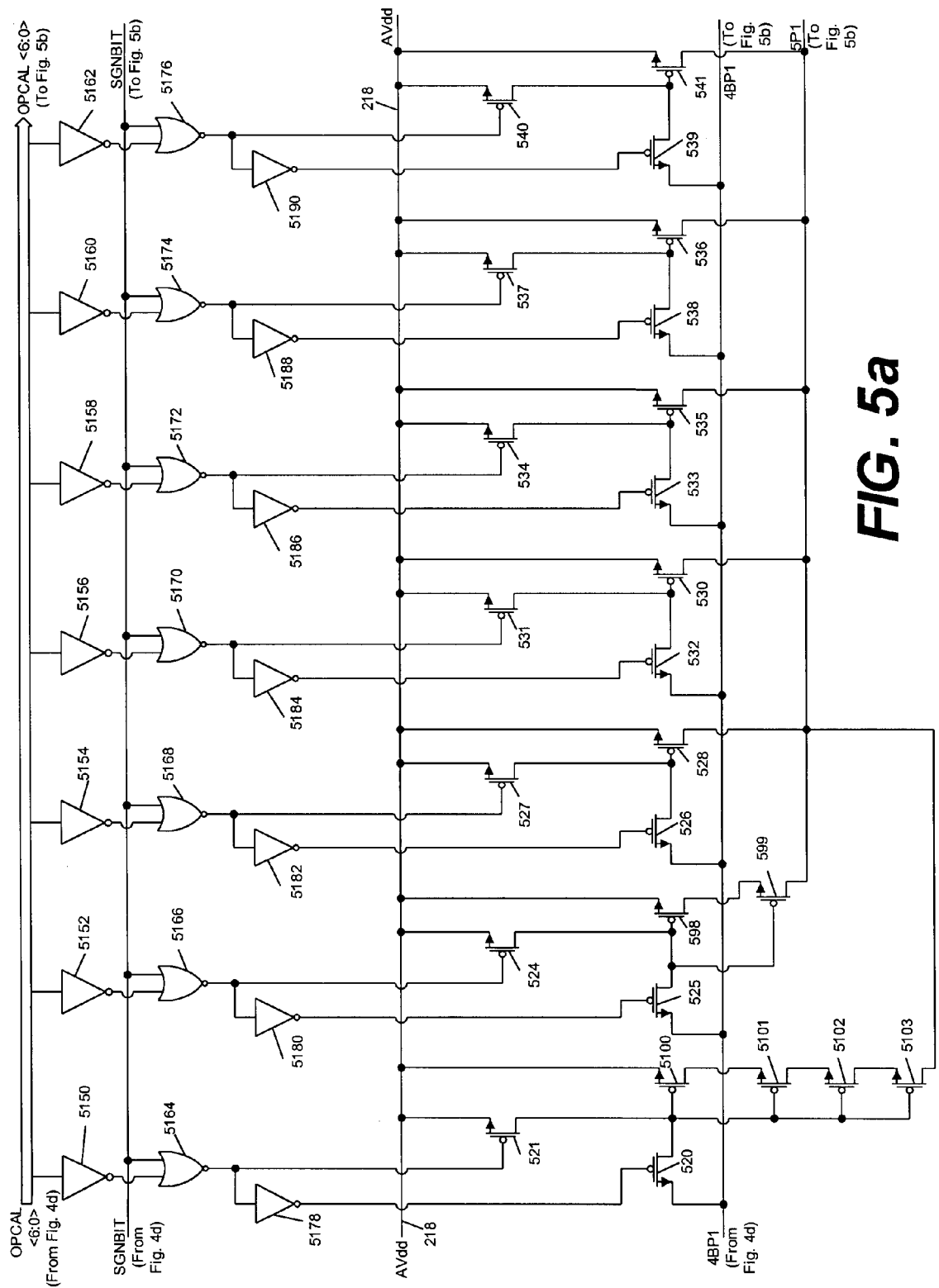
FIGS. 5a and 5b is a more detailed schematic circuit diagram of the current source op-amp calibration function block illustrated in FIG. 4d.
Figure 5B:
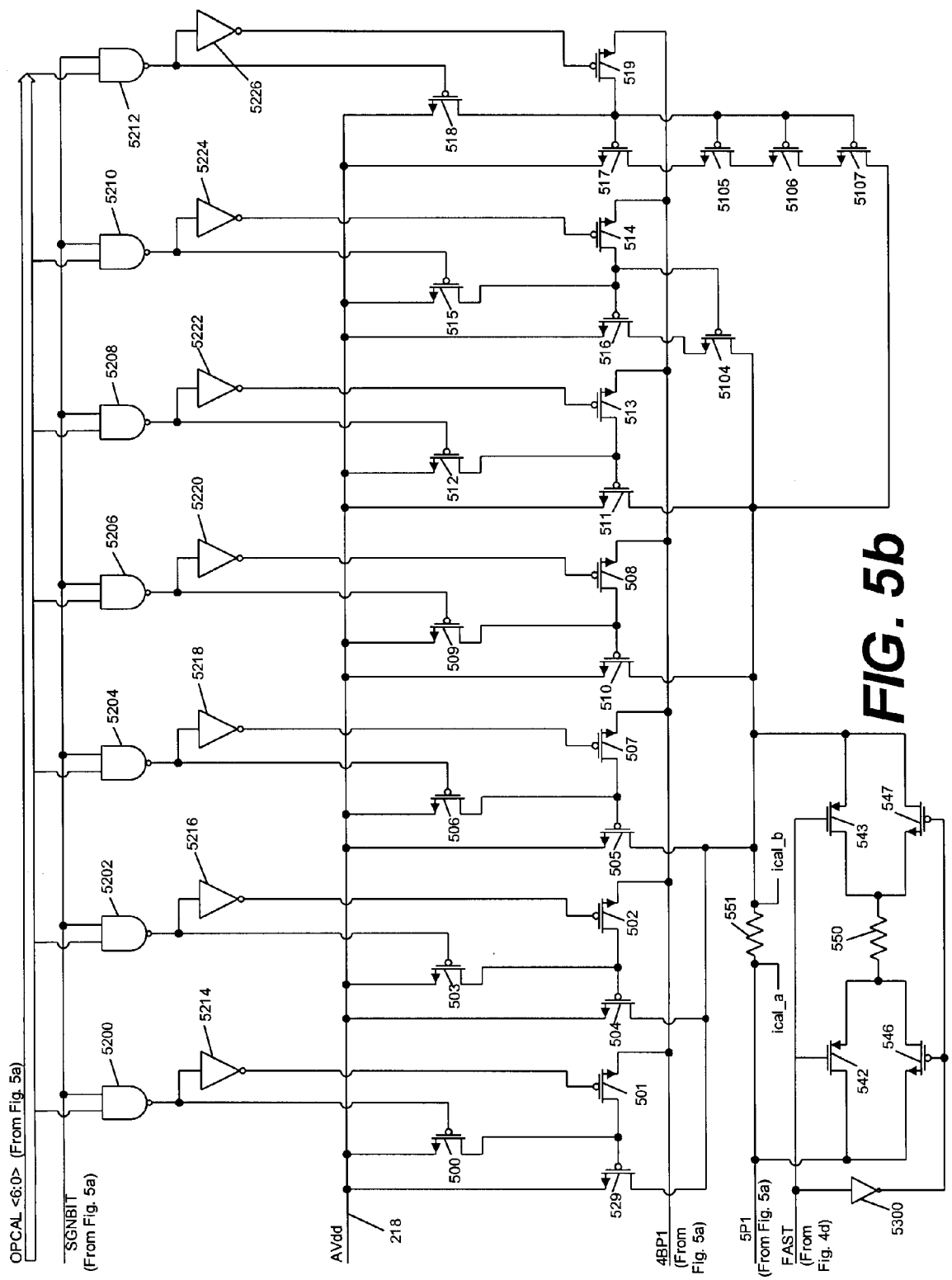

Referring now to FIGS. 5a and 5b, a more detailed schematic circuit diagram of the current source op-amp calibration function block 610 of FIG. 4d is illustrated. Calibration bus 206, which is connected to the fourth through ninth calib-op inputs of FIG. 4d, is thereby connected to the inputs of inverters 5150, 5152, 5154, 5156, 5158, 5160, and 5162, and to first inputs of NAND gates 5200, 5202, 5204, 5206, 5208, 5210, and 5212 The outputs of inverters 5150, 5152, 5154, 5156, 5158, 5160, and 5162 are connected to first inputs of NOR gates 5164, 5166, 5168, 5170, 5172, 5174, and 5176, respectively. The op-amp input labeled SGNBIT, which is connected to the second calib-op input of FIG. 4d, is thereby connected to second inputs of NOR gates 5164, 5166, 5168, 5170, 5172, 5174, and 5176, and to second inputs of NAND gates 5200, 5202, 5204, 5206, 5208, 5210, and 5212.

The outputs of NOR gates 5164, 5166, 5168, 5170, 5172, 5174, and 5176, are connected to the inputs of inverters 5178, 5180, 5182, 5184, 5186, 5188, and 5190, respectively, and to the gates of transistors 521, 524, 527, 531, 534, 537, and 540, respectively. The outputs of NAND gates 5200, 5202, 5204, 5206, 5208, 5210, and 5212 are connected to the inputs of inverters 5214, 5216, 5218, 5220, 5222, 5224, and 5226, respectively, and to the gates of transistors 500, 503, 506, 509, 512, 515, and 518, respectively. The outputs of inverters 5178, 5180, 5182, 5184, 5186, 5188, 5190, 5214, 5216, 5218, 5220, 5222, 5224, and 5226 are connected to the gates of transistors 520, 525, 526, 532, 533, 538, 539, 501, 502, 507, 58, 513, 514, and 519, respectively.

Positive power supply voltage 218 is connected to the sources of transistors 521, 524, 527, 531, 534, 537, 540, 5100, 598, 528, 530, 535, 536, 541, 500, 503, 506, 509, 512, 515, 518, 529, 504, 505, 510, 511, 516, and 517.

The drains of transistors 527, 531, 534, 537, 540, 500, 503, 506, 509, and 512 are connected to the drains of transistors 526, 532, 533, 538, 539, 501, 502, 507, 508, and 513, respectively, and to the gates of transistors 528, 530, 535, 536, 541, 529, 504, 505, 510, and 511, respectively. The drain of transistor 521 is connected to the gates of transistors 5100, 5101, 5102, and 5103, and the drain of transistor 520. The drain of transistor 524 is connected to the gates of transistors 598 and 599, and the drain of transistor 525. The drain of transistor 518 is connected to the gates of transistors 517, 5105, 5106, and 5107, and the drain of transistor 519. The drain of transistor 515 is connected to the gates of transistors 516 and 5104, and the drain of 514.

The first input of the current source op-amp calibration function block 610 of FIG. 4d is connected to the sources of transistors 520, 525, 526, 532, 533, 538, 539, 501, 502, 507, 508, 513, 514, and 519. The drain of transistor 5100 is connected to the source of transistor 5101. The drain of transistor 5101 is connected to the source of transistor 5102. The drain of transistor 5102 is connected to the source of transistor 5103. The drain of transistor 598 is connected to the source of transistor 599. The drain of transistor 5103 and the drains of transistors 599, 528, 530, 535, 536, and 541 are connected to the drain of transistor 542, the source of transistor 546, resistor 551, and the current source op-amp calibration function block 610 output ical_a (of FIG. 4d).

The drain of transistor 517 is connected to the source of transistor 5105. The drain of transistor 5105 is connected to the source of transistor 5106. The drain of transistor 5106 is connected to the source of transistor 5107. The drain of transistor 516 is connected to the source of transistor 5104. The drain of transistor 5104 is connected to the current source op-amp calibration function block 610 output ical_b (of FIG. 4d), to the drains of transistors 5107, 511, 510, 505, 504, 529, and 547, to the source of transistor 543 and to resistor 551.

The op-amp input labeled FAST, which is connected to the current source op-amp calibration function block 610 third input (of FIG. 4d), is connected to the input of inverter 5300 and the gates of transistors 542 and 543. The output of inverter 5300 is connected to the gates of transistors 546 and 547. On one side, resistor 550 is connected to the source of transistor 542 and the drain of transistor 546. On the other side, resistor 550 is connected to the drain of transistor 543 and the source of transistor 547.

The invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alternation and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A microcontroller system having a configurable operational amplifier as a peripheral, said system comprising:
    a microcontroller;
    a configurable operational amplifier having an analog input and an output, said configurable operational amplifier being programmably configurable for a desired set of parameters and characteristics; and
    a compression preamplifier having an input and an output, wherein the output is connected to the input of said configurable operational amplifier.

2. A microcontroller system having a configurable operational amplifier as a peripheral, said system comprising:
    a microcontroller;
    a configurable operational amplifier having an analog input and an output, said configurable operational amplifier being programmably configurable for a desired set of parameters and characteristics; and
    a current source operational amplifier calibration circuit connected to said configurable operational amplifier for minimizing said configurable operational amplifier input offset voltage.

3. The system of claim 2, wherein said configurable operational amplifier is programmably configured for a desired gain bandwidth product.

4. The system of claim 2, wherein said configurable operational amplifier is programmably configured as a voltage comparator.

5. The system of claim 2, wherein said configurable operational amplifier is programmably configured for minimum input voltage offset.

6. The system of claim 2, wherein said configurable operational amplifier is programmably configured for low input bias current.

7. The system of claim 2, wherein said configurable operational amplifier is programmably configured for ultra low input bias current.

8. The system of claim 1, wherein said configurable operational amplifier is programmably configured for rail-to-rail input operation.

9. The system of claim 1, wherein said configurable operational amplifier is programmably configured for rail-to-rail output operation.

10. The system of claim 2, wherein said configurable operational amplifier is programmably configured for a sleep mode.

11. The system of claim 2 wherein said microcontroller, said configurable operational amplifier and said current source operational amplifier calibration circuit are fabricated on an integrated circuit die.

12. The system of claim 11, further comprising an integrated circuit package enclosing said integrated circuit die.

13. The system of claim 12, wherein said integrated circuit package is selected from a group consisting of plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), T0-220, T0-247 and T0-263.

14. The system of claim 12, further comprising circuit functions selected from the group consisting of a random access memory, a program memory, a serial interface, an analog-to-digital converter, a digital-to-analog converter, digital input-output, a timer, and a programmable switching mode controller.

15. The system of claim 14, wherein said microcontroller, said configurable operational amplifier and the circuit functions are fabricated on an integrated circuit die.

16. The system of claim 14, wherein any one of said configurable operational amplifier and the circuit functions that are not being used are shut down to conserve power.

17. The system of claim 1, wherein said configurable operational amplifier is programmably configured for input operation at or about a first power supply rail.

18. The system of claim 1, wherein said configurable operational amplifier is programmably configured for input operation at or about a second power supply rail.

19. A configurable operational amplifier on a semiconductor integrated circuit, comprising:
    a configurable operational amplifier having an analog input and an output, said configurable operational amplifier being programmably configurable for a desired set of parameters and characteristics; and
    a compression preamplifier having an input and an output, wherein the output is connected to the input of said configurable operational amplifier, wherein said configurable operational amplifier and said compression preamplifier are fabricated on a semiconductor integrated circuit die.

20. A configurable operational amplifier on a semiconductor integrated circuit, comprising:

a configurable operational amplifier having an analog input and an output, said configurable operational amplifier being programmably configurable for a desired set of parameters and characteristics; and a current source operational amplifier calibration circuit connected to said configurable operational amplifier for minimizing said configurable operational amplifier input offset voltage, wherein said configurable operational amplifier and said current source operational amplifier calibration circuit are fabricated on a semiconductor integrated circuit die.

21. The configurable operational amplifier of claim 20, wherein said configurable operational amplifier is programmably configured for a desired gain bandwidth product.

22. The configurable operational amplifier of claim 20, wherein said configurable operational amplifier is programmably configured as a voltage comparator.

23. The configurable operational amplifier of claim 20, wherein said configurable operational amplifier is programmably configured for minimum input voltage offset.

24. The configurable operational amplifier of claim 20, wherein said configurable operational amplifier is programmably configured for low input bias current.

25. The configurable operational amplifier of claim 20, wherein said configurable operational amplifier is programmably configured for ultra low input bias current.

26. The configurable operational amplifier of claim 19, wherein said configurable operational amplifier is programmably configured for rail-to-rail input operation.

27. The configurable operational amplifier of claim 19, wherein said configurable operational amplifier is programmably configured for rail-to-rail output operation.

28. The configurable operational amplifier of claim 20, wherein said configurable operational amplifier is programmably configured for a sleep mode.

29. The configurable operational amplifier of claim 20, further comprising an integrated circuit package enclosing said integrated circuit die.

30. The configurable operational amplifier of claim 29, wherein said integrated circuit package is selected from a group consisting of plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), T0-220, T0-247 and T0-263.

31. The configurable operational amplifier of claim 19, wherein said configurable operational amplifier is programmably configured for input operation at or about a first power supply rail.

32. The configurable operational amplifier of claim 19, wherein said configurable operational amplifier is programmably configured for input operation at or about a second power supply rail.

* * * * *